United States Patent
Grung et al.

(10) Patent No.: US 6,650,720 B1
(45) Date of Patent: Nov. 18, 2003

(54) PHASE LOCK LOOP AND TRANSCONDUCTANCE CIRCUIT FOR CLOCK RECOVERY

(75) Inventors: Bernard L. Grung, Eden Prairie, MN (US); Moises E. Robinson, Austin, TX (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 09/218,382

(22) Filed: Dec. 22, 1998

(51) Int. Cl.$^7$ ................................................ H03D 3/24
(52) U.S. Cl. ..................................................... 375/375
(58) Field of Search ............................... 327/108, 157, 327/141; 332/127; 331/57; 370/311; 379/399.01, 387.01; 375/371, 373, 374, 375, 376

(56) References Cited

U.S. PATENT DOCUMENTS

| | | | | |
|---|---|---|---|---|
| 4,093,824 A | * | 6/1978 | Grosjean ........................ 381/4 |
| 4,101,842 A | * | 7/1978 | Ohsawa ....................... 330/257 |
| 5,053,718 A | * | 10/1991 | Graeme et al. ............. 330/260 |
| 5,345,190 A | * | 9/1994 | Kaylor ........................ 330/258 |
| 5,448,598 A | * | 9/1995 | Yousefi et al. ............... 375/376 |
| 5,483,180 A | | 1/1996 | Chai et al. ..................... 326/93 |
| 5,504,464 A | * | 4/1996 | Hwang ........................ 332/127 |
| 5,552,942 A | * | 9/1996 | Ziperovich et al. ........... 360/51 |
| 5,574,756 A | | 11/1996 | Jeong ........................... 375/376 |
| 5,600,272 A | * | 2/1997 | Rogers ........................ 327/103 |
| 5,783,971 A | * | 7/1998 | Dekker ......................... 331/17 |
| 5,936,441 A | * | 8/1999 | Kurita ......................... 327/141 |
| 5,945,855 A | * | 8/1999 | Momtaz ....................... 327/157 |

FOREIGN PATENT DOCUMENTS

| | | | |
|---|---|---|---|
| EP | 0595632 | 10/1993 | ........... H03L/7/107 |
| EP | 0856946 | 8/1998 | ........... H03L/7/085 |

OTHER PUBLICATIONS

Fiedler, A., et al., "A 1.0625Gbps Transceiver with 2x–Oversampling and Transmit Signal Pre–Emphasis", ISSCC97/Session 15./Serial Data Communications/Paper FP 15.1, IEEE Solid State Circuit Conference, 238, 1997.

Gardner, F.M., "Charge–Pump Phase–Lock Loops", IEEE Trans. Commun. vol. COM–28, 321–330, Nov. 1980.

Gardner, F.M., "Sequential Phase Detectors", PhaseLock Technologies, Second Edition, John Wiley & Sons, 121–125.

Hogge, Jr., C.L., "A Self Correcting Clock RecoveryUnit", IEEE Journal of Lightwave Technology, vol. LT–3, 1312–1314, Dec. 1985.

Peterson, C., et al., "A 3–5.5VCMOS 32Mb/s Fully–Integrated Read Channel for Disk–Drives", IEEE Custom Integrated Circuits Conference, vol. 10, Chapter 2, 1–4, 1993.

Rezzi, F. et al., "A 70–mW Seventh–Order Filter with 7–50 MHz Cutoff Frequency and Programmable Boost and Group Delay Equalization", IEEE Journal of Solid State Circuits, vol. 32, No. 12, 1987–1999, Dec. 1997.

(List continued on next page.)

*Primary Examiner*—Stephen Chin
*Assistant Examiner*—Kevin Kim
(74) *Attorney, Agent, or Firm*—Schwegman, Lundberg, Woessner & Kluth; Timothy W. Markison

(57) ABSTRACT

A high speed data communication system includes a receiver to recover data and clock signals from communicated data. The receiver circuit has a dual phase lock loop (PLL) circuit. A fine loop of the PLL includes a phase detector providing a differential analog voltage output. Transconductance circuitry converts the differential analog voltage output to a low current analog output. The transconductance circuitry has a high impedance output, a small transconductance value and can provide variable gain control. A coarse loop of the PLL allows for frequency acquisition of an internal oscillator.

30 Claims, 7 Drawing Sheets

FIG. 2

OTHER PUBLICATIONS

Steininger, J.M., "Understanding Wide–band MOS Transistors", Circuits and Devices, 26–31, May 1990.

Lin, J.Y., et al., "Design of Clock Recovery MMIC using large–signal computer–aided analysis", *Micowave Symp. Digest, IEEE MTT–s Int'l, vol. 3, XP002135220*, 1181–1184, (1995).

Wu, L., et al., "A Low Jitter 1.25GHz CMOS analog PLL for clock recovery", *Proceedings of the 1998, IEEE Int'l Symp. of Circuits and Systems, ISCAS '98 vol. 1, XP002135219*, 167–170, (May 1998).

Akin, T., "A Wireless Implantable Multichannel Digital Neural Recording System for a Micrmachined Sieve Electrode", *IEEE Journal of Solid–State Circuits, 33*, 109–118, (Jan. 1998).

Gardner, F.M., "Phase Accuracy of Charge Pump PLL's", *IEEE Trans. Commun, COM–30*, 2362–2363, (Oct. 1982).

Gregorian, R., et al., "Switched–Capacitor Circuit Design", *IEEE, 71*, 941–966, (Aug. 1983).

Meyer, R.G., et al., "Monolithic AGC Loop fpr a 160 Mb/s Transimpedance Amplifier", *IEEE Journal of Solid–State Circuits, 31*, 1331–1335, (Sep. 1996).

Moon, Y., "A 32×32–b Adiabatic Register File with Supply CLock Generator", *IEEE Journal of Solid–State Circuits, 33*, 696–701, (May 1998).

Nakamura, M., et al., "A 156–Mb/s CMOS Optical Receiver for Burst–Mode Transmission", *IEEE Journal of Solid–State Circuits, 33*, 1179–1187, (Aug. 1998).

Su, D.K., et al., "An IC for Linearizing RF Power Amplifiers Using Envelope Elimination and Restoration", *IEEE Journal of Solid State Circuits, 33*, 2252–2258, (Dec. 1998).

* cited by examiner

PHASE LOCK LOOP AND TRANSCONDUCTANCE CIRCUIT FOR CLOCK RECOVERY

TECHNICAL FIELD OF THE INVENTION

The present invention relates generally to clock recovery and in particular the present invention relates to phase lock loop and transconductance circuitry for recovering a clock from high data rate signals.

BACKGROUND OF THE INVENTION

Clock and data recovery in high speed data communication systems require receiver circuits which can adjust an internal oscillator to a frequency and phase of the communicated data. For a description of clock recovery, see C. R. Hogge, "A Self Correcting Clock Recovery Circuit," IEEE, J. Lightwave Technol. LT-3 1312 (1985). Hogge describes a receiver circuit which adjusts a recovered clock signal to center the clock signal transitions in a center of the communicated data signal.

The receiver circuits typically require a phase lock loop circuit to acquire the clock signal from the transmitted data. Phase lock loop circuits adjust an internal oscillator to match a phase of an externally supplied reference signal, such as the received data signal. These phase lock loop circuits compare the reference signal to the internal oscillator signal and provide an output which is used to adjust the oscillator. For example, a parallel digital phase lock loop architecture is described in Fiedler et al., "A 1.0625 Gbps Transceiver with 2x-Oversampling and Transmit Signal Pre-Emphasis," ISSCC 1997 Dig. Tech. Papers, 238 (1997).

High speed data recovery in a communication system operating in excess of 1 GHz requires high speed components, a speed which is difficult to achieve in complementary metal oxide semiconductor (CMOS) fabrication. In particular, current CMOS fabrication sizes of about 0.25 to 0.35 micron have NMOS transistors with a frequency cutoff $f_t$ of about 10 to 15 GHz. Thus, processing a signal with a frequency of about 1.25 GHz pushes the transistors to their limitations. Further, gain control in a conventional receiver circuit adjusts the input signal prior to processing with a phase lock loop. Using CMOS processing, accurately adjusting the gain of the high frequency input data is not presently possible. The economics of IC fabrication create a need for a solution to high speed clock recovery using CMOS technology.

For the reasons stated above, and for other reasons stated below which will become apparent to those skilled in the art upon reading and understanding the present specification, there is a need in the art for a CMOS receiver circuit capable of recovering a clock signal and data in a high speed data communication system. Further, there is a need for a receiver which can adjust gain to changes in the communication data voltage.

SUMMARY OF THE INVENTION

The above mentioned problems with high speed data communication receiver circuits and other problems are addressed by the present invention and will be understood by reading and studying the following specification.

In particular, the present invention describes a high speed data receiver comprising a phase detector circuit coupled to receive a high speed input data signal and provide an analog voltage output indicating a signal phase difference between the high speed input data signal and a second input signal. A transconductance circuit is provided to convert the analog voltage output into an analog output current. An oscillator provides the second input signal to the phase detector in response to the analog output current.

In another embodiment, a high speed data receiver comprises a phase detector circuit coupled to receive a high speed input data signal and provide differential analog voltage outputs indicating a signal phase difference between the high speed input data signal and a second input signal. The receiver further includes a transconductance circuit coupled to the phase detector circuit for converting the differential analog voltage outputs into an analog output current, an oscillator coupled to the transconductance circuit and providing the second input signal to the phase detector in response to the analog output current, and a phase frequency detector circuit coupled to receive an output of the oscillator and provide an output indicating a frequency difference between the output of the oscillator and a reference clock signal. A charge pump circuit provides an output signal in response to the phase frequency detector circuit. The charge pump output signal is coupled to an input of the oscillator.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

The term "serial" is used here to define a receiver architecture for which the clock recovery and the data recovery are accomplished at the full data rate, for example 1.25 Gb/s. The serial approach requires circuits to operate with a 1.25 GHz clock rate—a requirement that is very difficult to achieve with a 0.35 $\mu$m CMOS integrated circuit fabrication process.

The term "parallel" is used here to define a receiver architecture where the input data stream is sampled at a sampling rate of at least the full data rate, such as 1.25 Gb/s or greater, and the sampled data is processed in several parallel paths. Each path can then operate with a relaxed clock rate compared to the serial approach.

Figure 1:
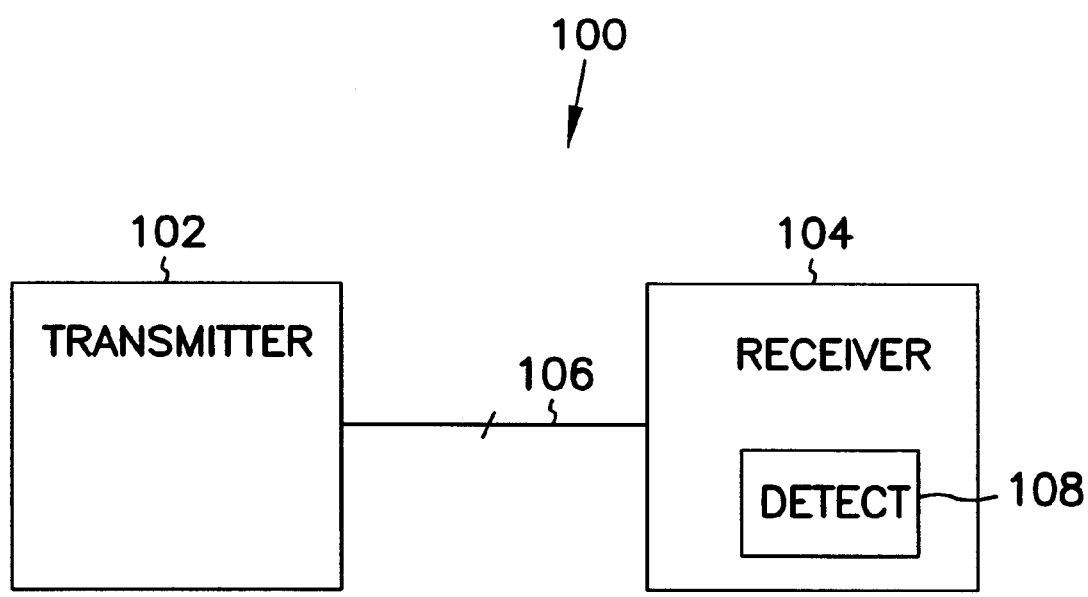
FIG. 1 is a block diagram of a data communication system.

Referring to FIG. 1, a communication system 100 is described which operates at high communication speeds. The system includes transmitter 102 and receiver 104 units. The data connections 106 between the transmitter and the receiver units can operate at data rate speeds of about 1.25 Gb/s or greater. The data connections 106 do not include a clock line for synchronizing the receiving units with the transmitting units, but can include complementary data lines. As such, the receiving units include detection circuitry 108 for recovering the clock signal from the received data. In one embodiment, the detection circuitry includes a dual loop phase lock loop circuit connected to receive the incoming data signals. The dual loop function allows frequency acquisition with a coarse loop and precise phase control with a fine loop. The receiver, in one embodiment, includes a transconductance function with a small value, such as about 10 µS (microSiemens). Further, a variable gain function can be provided in the phase lock loop circuit to allow for variable input signal voltages.

Figure 2:
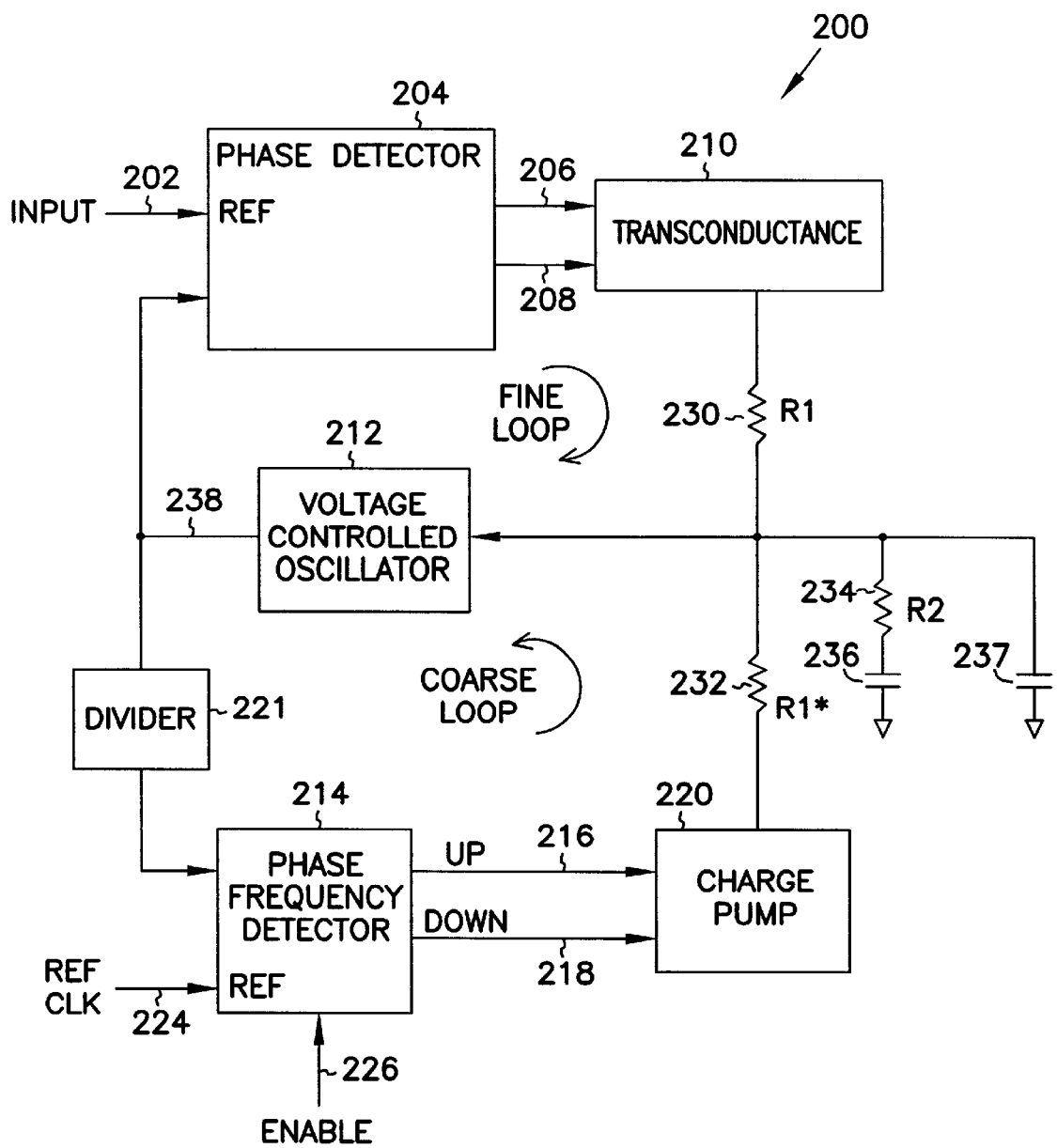
FIG. 2 is a diagram of a dual loop phase lock loop circuit.

FIGS. 2–9 illustrate different embodiments of phase lock loop circuits and transconductance circuitry. The basic phase lock loop circuit 200 includes a coarse loop and a fine loop (FIG. 2). The fine loop uses a phase detector 204 which provides differential analog voltage outputs 206 and 208, $Vi_P$ and $Vi_N$, respectively. The fine loop processes the input data 202 as the phase reference for phase detector 204. The analog outputs of the phase detector are converted to an analog current by a unique transconductance circuit 210. The analog output current is coupled to a voltage controlled oscillator (VCO) 212. The VCO can be any kind of oscillator, including but not limited to a ring oscillator. The VCO is coupled to a second input of the phase detector. In operation, the fine loop adjusts the VCO signal to correspond to the phase of the input data. In one embodiment, the voltage controlled oscillator 212 is a five-stage ring oscillator which is tapped to provide ten output clock signals with the same frequency, but different phases.

The coarse PLL uses a reference clock signal 224, for example 62.5 MHZ, as a frequency reference for a phase-frequency detector (PFD) 214 for rapid frequency acquisition. The PFD is coupled to a charge pump circuit 220 which in turn adjusts an input voltage of voltage controlled oscillator 212. As illustrated, VCO 212 is shared between the coarse and fine loops of the phase lock loop circuit.

A detailed description of the phase lock loop circuitry is provided in the following paragraphs. The phase lock loop circuit is broken into two halves, the fine and coarse loops. A description of the fine loop circuitry is first provided, followed by the coarse loop.

Figure 3:
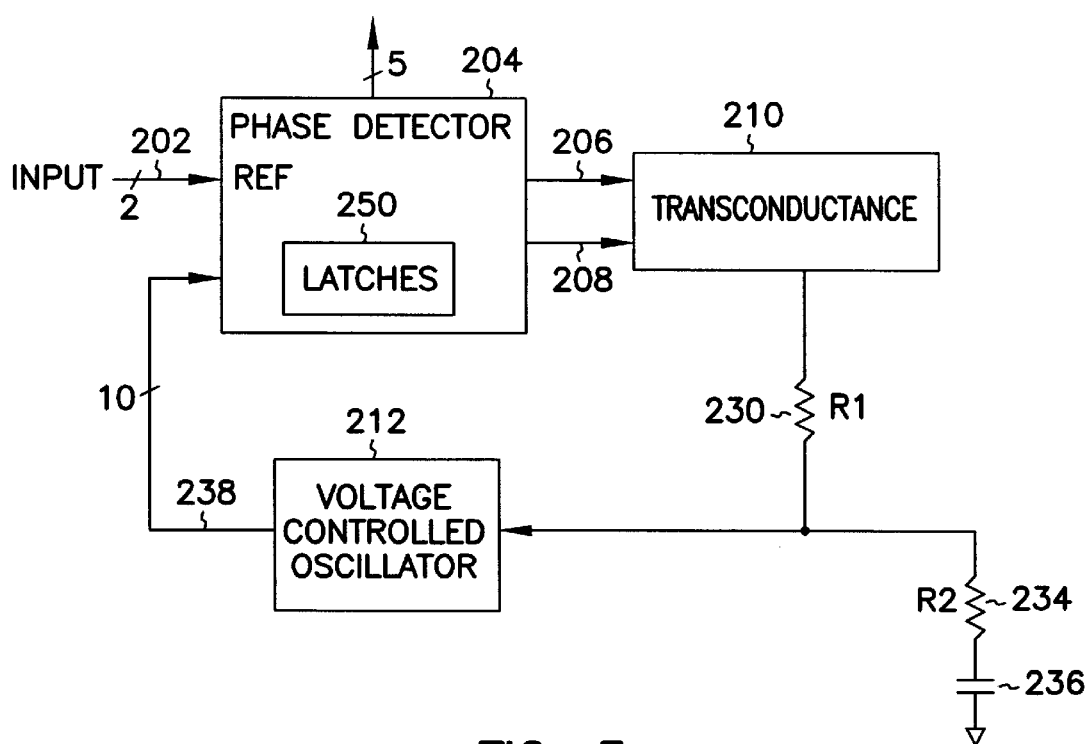
FIG. 3 is a diagram of a fine loop circuit.

A schematic diagram of the fine PLL circuitry is given in FIG. 3. The phase detector (PD) 204 oversamples the input data by a factor of 2 and provides 5 parallel data outputs at 1/10 the input data rate. Input data lines 202 comprise complementary data lines. Ten high-speed capture latches 250 are used to convert the serial input data into parallel data paths. That is, the input data is sampled twice per data bit. One sample is in the middle of the data period and the other sample is at the edge of the data period. The edge sample is used to adjust the phase of the PLL circuit, and the middle sample is used as one of the five parallel data outputs.

The five middle samples are also used as a logic function to determine the validity of the edge samples. When two adjacent middle samples have the same value, then the intervening edge sample is invalid and is rejected. When two adjacent middle samples differ in value, then the magnitude of the intervening edge sample is valid and the sign of the value needs to be determined. A positive sign is used for a positive transition, and a negative sign is used for a negative transition. When valid, the resulting edge sample is proportional to the phase error.

When the input data is provided at 1.25 Gb/s, each path operates with a 0.125 GHz clock. The PD, therefore, produces a complementary pair of analog voltage outputs 206 and 208 which have a differential voltage proportional to the phase error between the input data and a clock running at 10 times the voltage controlled oscillator frequency.

The transconductance circuit 210 converts this differential analog voltage to an analog current which passes through resistors 230 ($R_1$) and 234 ($R_2$) and which changes the charge on capacitor 236. An optional capacitor 237 can be coupled to resistor 234. The voltage divided by resistors 230 and 234 controls the oscillator 212 input voltage. The effective transconductance of the transconductance circuit is about 10 µS for a 1 V input signal. Thus, a 1-V, single-sided, peak-to-peak error voltage produces a difference voltage of 2 V peak-to-peak and a 20 µA peak-to-peak output current (±10 µA peak current centered around 0 A). The operation of the fine PLL can be described by:

$$\omega_N = \sqrt{\frac{MK_O K_P}{(R_1 + R_2)C}} \tag{1}$$

and $$\zeta = \frac{\omega_N}{2} R_1 C \tag{2}$$

where $\omega_N$ is the natural frequency, $\zeta$ is the damping factor, $K_O$ is the VCO gain, $K_P$ is the phase detector gain and M is the phase detector multiplication factor. Moreover, $R_1$, $R_2$ and C are the filter elements. The voltage controlled oscillator 212 runs at about 250 MHz with a gain of about 0.5 GHz/V. This gain is multiplied by a factor of ten to give an effective oscillator gain of 5 GHz/V. The M factor in Equation (1) is thus equal to ten.

An important element in the receiver circuit 200 is the transconductance circuit 210 which must convert a 1 V single-sided error voltage signal into a current of approximately 10 µA for controlling the voltage controlled oscillator 212. In one embodiment, the transconductance circuit 210 also provides variable gain amplification, as described below. The transconductance circuit contains, a double-sided to single-sided converter, source degeneration resistors to reduce overall gain, and current mirrors to reduce the current at the output by a factor of A, also as explained below. In one embodiment, the reduction factor A is equal to 10.

Figure 4:
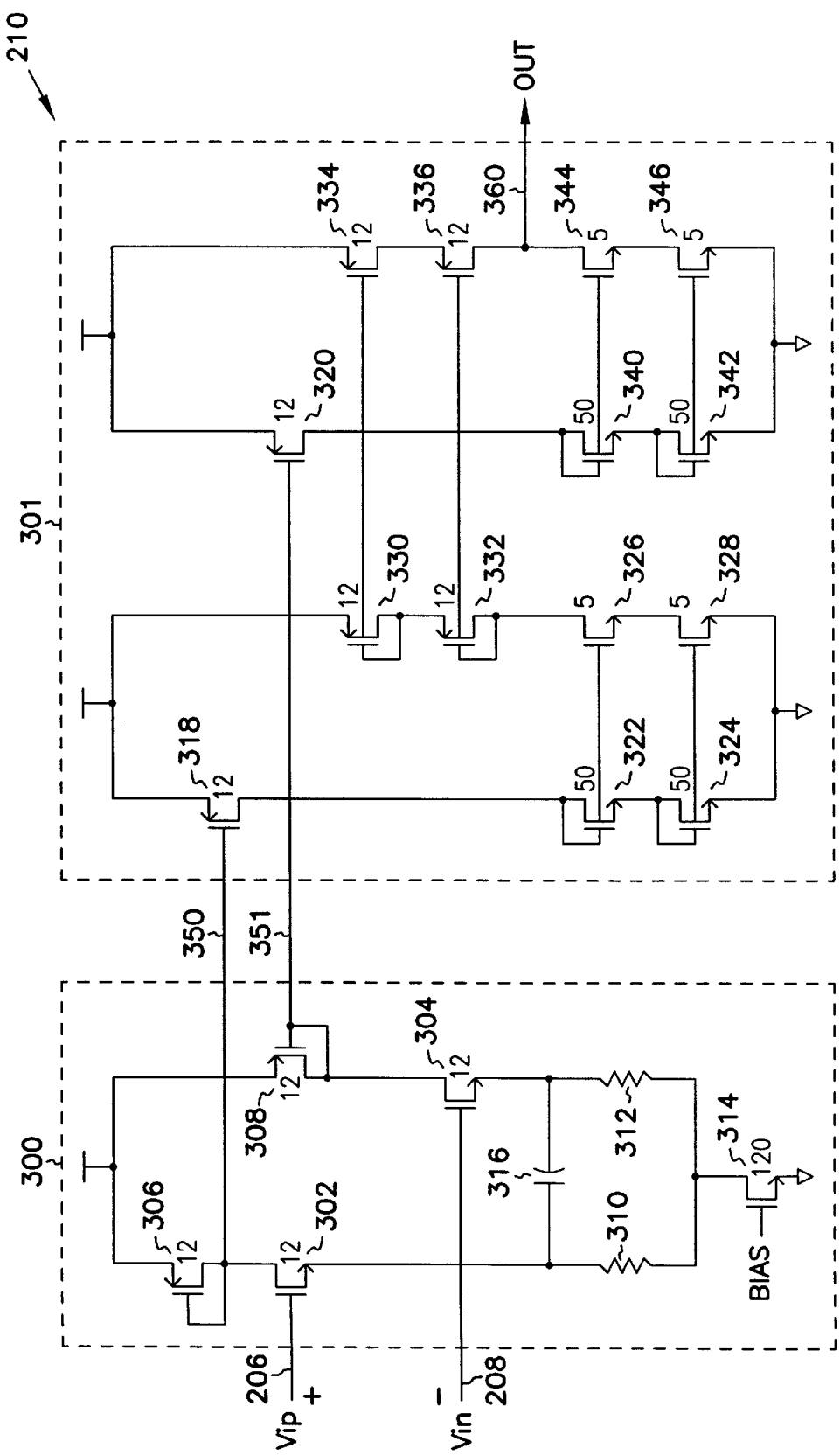
FIG. 4 is a schematic diagram of a transconductance circuit.

FIG. 4, illustrates a schematic diagram of one embodiment of the transconductance circuit. The transconductance circuit has an input stage 300 and an output stage 301. The input stage receives the differential voltage outputs from the phase detector circuit and provides intermediate outputs 350 and 351. The input stage operates as a differential amplifier with active loads (transistors 306 and 308) and degeneration resistors (310 and 312). The input stage includes two n-channel input field effect transistors 302 and 304. A diode-connected (drain and gate connected) p-channel transistor 306 is connected between Vdd and the drain of transistor 302. Likewise, a p-channel transistor 308 is connected between Vdd and the drain of transistor 304. The source of transistor 302 is coupled to Vss through resistor 310 and transistor 314, and the source of transistor 304 is coupled to Vss through resistor 312 and transistor 314. A capacitor 316 is provided between the sources of transistors 302 and 304. In operation, variations in the differential input voltages on the gates of transistors 302 and 304 change currents through transistors 306 and 308. Thus, voltages on intermediate outputs 350 and 351 also change. The intermediate outputs 350 and 351 are respectively coupled to p-channel transistors 318 and 320, of the output stage 301. The 20. currents through transistors 306 and 308, therefore, are mirrored through transistors 320 and 318.

The output stage 301 provides a low current, high impedance output 360. The output provides a current in response to the linear differential input voltage. The output stage includes a pull-up circuit and a pull-down circuit. The pull-up circuit includes transistors 318, 322, 324, 326, 328, 330, 332, 334 and 336. Series connected n-channel transistors 322 and 324 are connected as diodes (gate coupled to drain) and conduct the same current mirrored in transistor 318. Transistors 326 and 328 are sized to conduct one-tenth the current of transistors 322 and 324, respectively. Thus, the current through transistors 322 and 324 is mirrored and divided by ten through transistors 326 and 328. 30 This, reduced current is mirrored through p-channel transistors 330 and 332 to p-channel transistors 334 and 336. Transistors 334 and 336 are coupled to output node 360 to pull-up the output node and increase the output current.

The output stage pull-down circuit includes transistors 320, 340, 342, 344, and 346. Series connected n-channel transistors 340 and 342 are connected as diodes (gate coupled to drain) and conduct the same current mirrored in transistor 320. Transistors 344 and 346 are sized to conduct one-tenth the current of transistors 340 and 342, respectively. Thus, the current through transistors 340 and 342 is mirrored and divided by ten through transistors 344 and 346. Transistors 344 and 346 are coupled to output node 360 to pull-down the output node and decrease the output current.

In operation, transistor 314 is activated and the differential voltage across the gates of transistors 302 and 304 result in a current output at node 360. Thus, as a voltage on the gate of transistor 302 increases, the current through transistors 334 and 336 increases. Likewise, as a voltage on the gate of transistor 304 increases, the current through transistors 344 and 346 increases.

Figure 5:
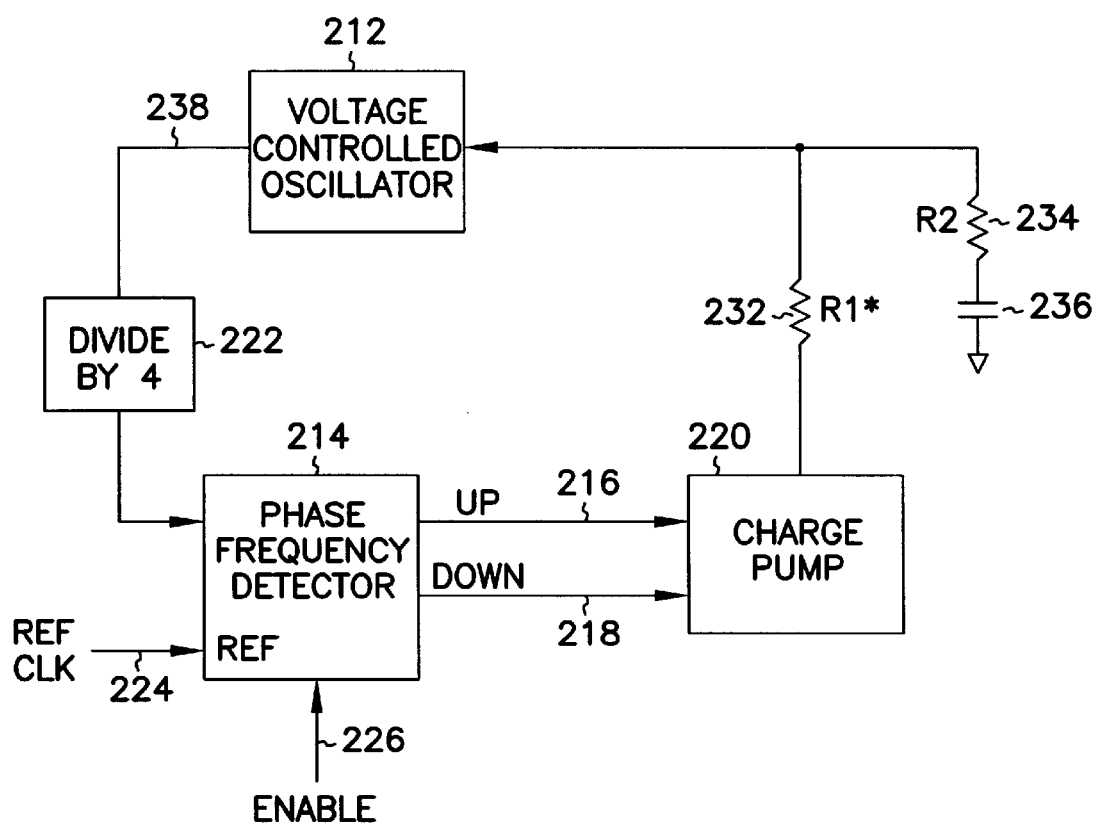
FIG. 5 is a diagram of a coarse loop circuit.

A schematic diagram of the coarse loop is shown in FIG. 5. The coarse loop includes a phase frequency detector 214 which uses a crystal reference frequency at input 224 and an output of the VCO circuit 212. The output of the VCO circuit is divided by four using divider circuit 222. An enable signal can be provided at input 226 to the phase frequency detector to inhibit the operation of the coarse loop after frequency acquisition by the VCO. The phase frequency detector provides output signals 216 and 218 to control charge pump 220. The charge pump provides an output current through resistor 232 ($R_1^*$). Again, this current is coupled to resistor 234, capacitor 236 and the shared oscillator circuit 212. Thus, the coarse loop is used to adjust the frequency of the VCO circuit to the crystal frequency.

The coarse PLL can be described by:

$$\omega_N^* = \sqrt{\frac{K_O I_P}{2\pi C N}} \quad (3)$$

and $$\zeta^* = \frac{\omega_N^*}{2} R_2 C \quad (4)$$

where $\omega_N^*$ is the natural frequency and $\zeta^*$ is the damping factor. The asterisk is used here to identify variables associated with the coarse PLL. The variables $K_O$, $R_1^*$, $R_2$ and C are similar to those defined for the fine PLL. $I_p$ is the maximum current of the charge pump 220 and N is equal to 4, which corresponds to the divider (Divide by 4) circuit 222. Since both the transconductance 210 and charge pump 220 circuits provide current pulses, resistors $R_1$ and $R_1^*$ can be made small. For example, the resistances can be 100Ω, or smaller, even zero.

The above described receiver embodiment provides a high speed clock recovery circuit which operates on a 1 V peak-to-peak input signal. Because the input voltage can vary from 100 mV to 1 V peak-to-peak, another embodiment of the receiver circuit includes variable gain amplification to increase the transconductance from about 10 μS to about 100 μS. Before describing a receiver circuit which includes variable gain amplification, it is noted that the high speed data rates and a 0.35 μm CMOS fabrication process does not allow for reliable variable gain amplification at the input of the phase detector 204. Thus, the following embodiments implement a unique variable gain amplifier implemented with the transconductance circuit. It will be understood that in the above described circuitry, the number of latches, data outputs, VCO stages, crystal frequency, magnitude of the transconductance and the divider circuit is not critical to the invention. These numbers can be varied by one skilled in the art, upon reading the present description, without deviating from the present invention.

As described above, the transconductance circuit 210 of FIGS. 3 and 4 includes an input stage 300 which is configured as a differential amplifier with active/transistor loads (306 and 308) and degeneration resistors (310 and 312). In one embodiment of the transconductance circuit for the Gigabit receiver, a transconductance of about 10 μS is needed for a 1V, single-sided, peak-to-peak voltage. The transconductance should increase to 100 μS when a 100 mV, single-sided peak-to-peak voltage is applied as input to the phase detector 204. A transconductance circuit with an inverse linear relationship between the input voltage and the transconductance is desired.

Figure 6B:
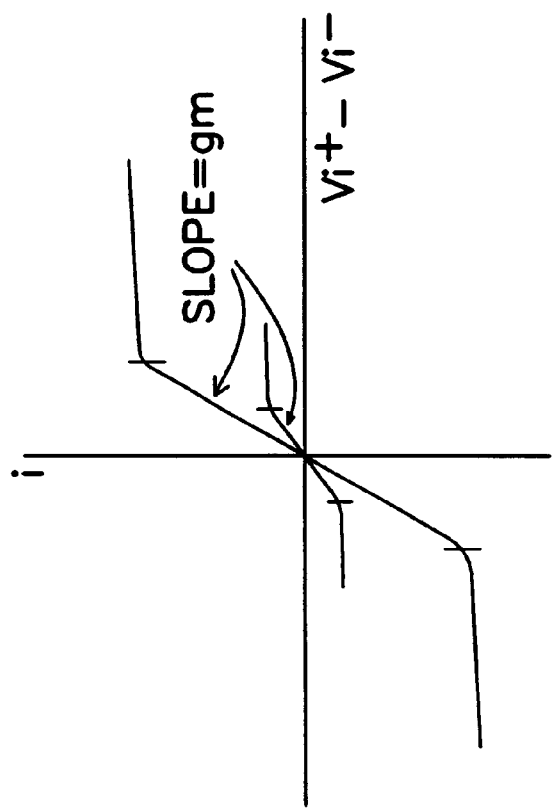
FIG. 6B is a graph illustrating operation of the input stage of FIG. 6A.
Figure 6A:
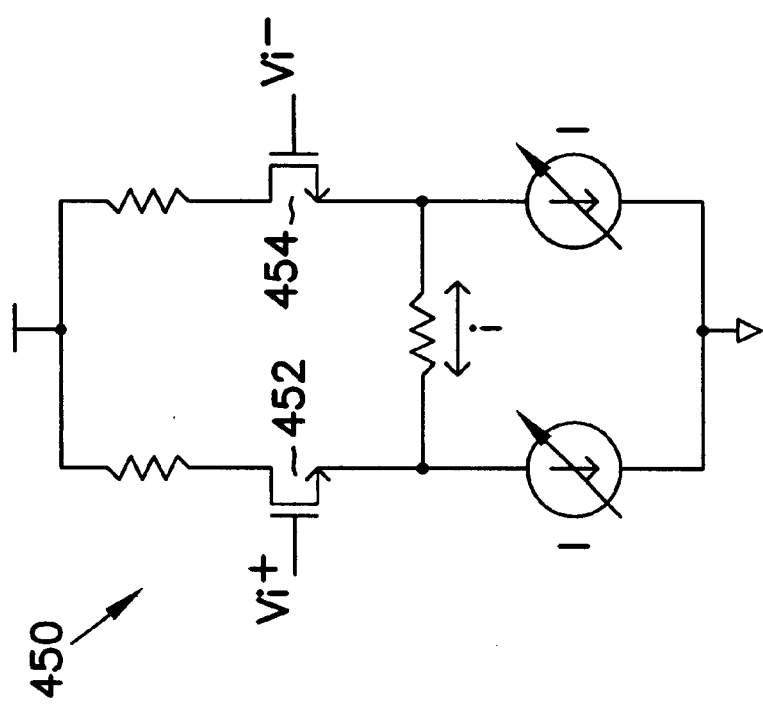
FIG. 6A is a schematic diagram of an input stage for a transconductor.

To illustrate a problem with achieving an inverse linear relationship, an example input stage 450 is shown in FIGS. 6A and 6B. The $g_m$ value of this circuit can be programmed by varying the value of the bias currents I. The linear range for the circuit of FIGS. 6A and 6B is defined as the region ($V_i^+-V_i^-$) where the slope of current I vs ($V_i^+-V_i^-$) curve is constant to within a predefined linear specification. This slope is the $g_m$ value:

$$g_m = \left| \frac{i}{V_i^+ - V_i^-} \right| \quad (5)$$

The linear range of the circuit of FIG. 6A is directly proportional to the excess bias voltage of transistors 452 and 454 (vdsat), and vdsat≈Vgs-Vt. Where Vgs is the gate to source voltage of transistors 452 and 454, and Vt is the threshold voltage of transistors 452 and 454. The following proportionality relationships hold between the different parameters for circuit 450: linear range $\propto g_m \propto$ vdsat $\propto$ I. Thus, as the $g_m$ value increases, the linear range for circuit 450 increases. Likewise, as the $g_m$ value decreases, the linear range for circuit 450 decreases. This behavior is opposite of what is needed for the fine loop transconductance circuit.

Figure 7B:
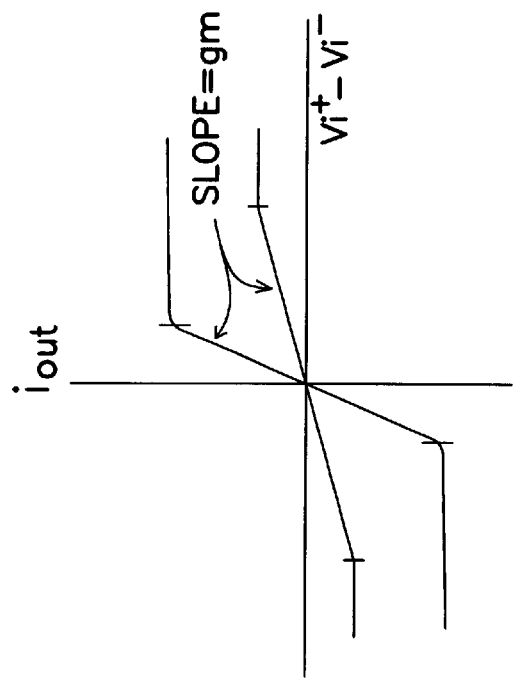
FIG. 7B is a graph illustrating operation of the dual transconductance circuit of FIG. 7A.
Figure 7A:
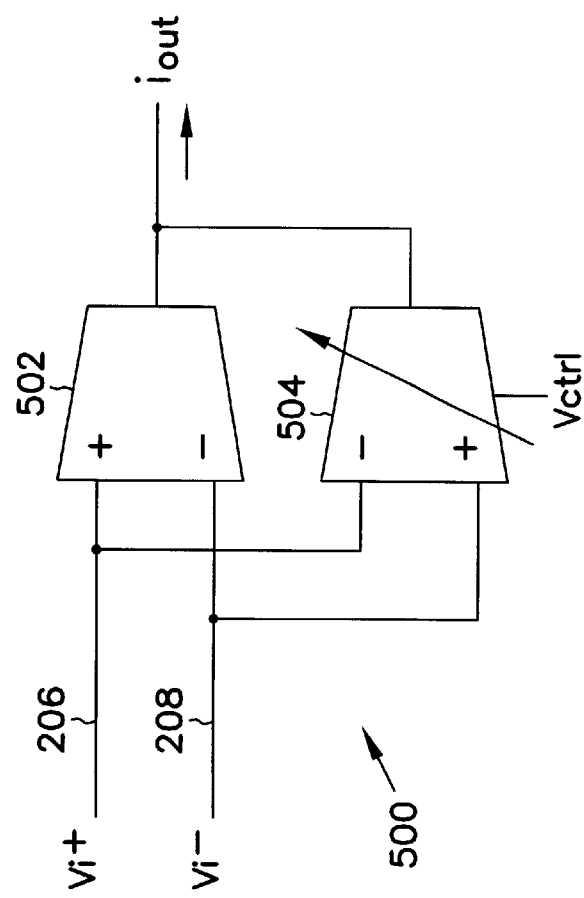
FIG. 7A is a block diagram of a dual transconductance circuit.

FIGS. 7A and 7B illustrate a transconductance circuit 500 which has an inverse linear relationship between the input differential voltage and the transconductance. The circuit 500 solves the problem of the relationship between the $g_m$ value and the linear range, but also allows for a large programming range. For a 3V CMOS process, circuit 500 can achieve a programming range of 5× to 10×. Thus, the receiver could support input voltages from 100 mV to 1 V peak-to-peak single-ended.

The circuit of FIG. 7A has two (almost identical) transconductance circuits 502 and 504 which are connected in parallel to receive the differential analog voltage inputs. The first transconductor 502 has a fixed transconductance $g_{m1}$, and the second transconductor 504 has a variable transconductance $gm_{m2}$. Transconductance circuit 504 as its inputs reversed in comparison to circuit 502. Thus, the overall effective transconductance for the dual circuit approach can be expressed as:

$$g_m = \left| \frac{iout}{V_i^+ - V_i^-} \right| = g_{m1} - g_{m2} \quad (6)$$

If the transconductance $g_{m1}$ of the first circuit 502 is set at about 100 µS, and the transconductance $gm_{m2}$ of the second circuit 504 varies from about 50 µS to 90 µS, the effective transconductance has a 5×range from 10 µS to 50 µS. If both transconductance circuits ($g_{m1}$ and $g_{m2}$) use the input stage embodiment 300, shown in FIG. 4, the relationship between the $g_m$ (effective) value and linear range of the transconductor is as shown in FIG. 7B. The control voltage Vctrl for transconductor 504 is generated by a control loop that adjusts the voltage according to the magnitude of the receiver input signal 202.

Conclusion

A high speed data communication system has been described which has a receiver to recover data and clock signals from the communicated data. The receiver circuit has a dual phase lock loop (PLL) circuit. A fine loop of the PLL includes a phase detector having a differential analog voltage output. Transconductance circuitry has been described which converts the differential analog voltage output to a low current analog output. The transconductance circuitry has a high impedance output, a small transconductance value (~10 to 100 µS) and can provide variable gain control. A coarse loop of the PLL allows for frequency acquisition of an internal oscillator.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A high speed data receiver comprising:
    a phase detector circuit coupled to receive a high speed input data signal and provide at least two analog voltage outputs;
    a transconductance circuit coupled to the phase detector circuit for converting the at least two analog voltage outputs into an analog output current, wherein the transconductance circuit includes a variable gain adjust circuit for adjusting a gain of the transconductance circuit in response to variations in a magnitude of the high speed input data signal;
    an oscillator coupled to the transconductance circuit and providing the second input signal to the phase detector in response to the analog output current;
    a phase frequency detector circuit coupled to receive an output of the oscillator and provide an output indicating a frequency difference between the output of the oscillator and a reference clock signal; and
    a charge pump circuit for providing an output signal in response to the phase frequency detector circuit, the charge pump output signal is coupled to an input of the oscillator.

2. The high speed data receiver of claim 1 wherein the transconductance circuit has a transconductance value of substantially equal to 10 µS.

3. The high speed data receiver of claim 1 wherein the transconductance circuit has a programmable or variable transconductance value in a range of substantially equal to 10 to 100 µS.

4. The high speed data receiver of claim 1 wherein the transconductance comprises a differential input stage having degeneration resistors to reduce a gain of the transconductance circuit.

5. The high speed data receiver of claim 4 wherein the transconductance circuit comprises an output stage having current mirrors to reduce a current at the output of the transconductance circuit.

6. The high speed data receiver of claim 1 wherein the transconductance circuit includes a bias voltage adjust circuit for adjusting a gain of the transconductance circuit.

7. A high speed data receiver comprising:
    a phase detector circuit coupled to receive a high speed input data signal and provide differential analog voltage outputs indicating a signal phase difference between the high speed input data signal and a second input signal;
    a transconductance circuit coupled to the phase detector circuit for converting the differential analog voltage outputs into an analog output current;
    an oscillator coupled to the transconductance circuit and providing the second input signal to the phase detector in response to the analog output current, wherein the oscillator comprises a second transconductance circuit configured to convert an intermediary analog voltage generated from the analog output current to an intermediary analog current and a ring oscillator configured to receive said intermediary analog current and to provide the second input signal;
    a phase frequency detector circuit coupled to receive an output of the oscillator and provide an output indicating a frequency difference between the output of the oscillator and a reference clock signal; and
    a charge pump circuit for providing an output signal in response to the phase frequency detector circuit, the charge pump output signal is coupled to an input of the oscillator.

8. The high speed data receiver of claim 7 wherein the high speed input data signal has a frequency of substantially equal to 1.25 GHz and the reference clock signal is substantially equal to 62.5 MHz.

9. The high speed data receiver of claim 7 further comprising a divide circuit coupled between the oscillator and the phase frequency detector, the divide circuit divides the output of the oscillator by a predetermined value.

10. The high speed data receiver of claim 7 wherein the oscillator is a ring oscillator.

11. The high speed data receiver of claim 7 wherein the high speed input data signal has a frequency of substantially equal to 1.25 GHz and the oscillator provides ten output signals each having a frequency of substantially equal to 250 MHz.

12. The high speed data receiver of claim 7 wherein the transconductance circuit comprises:
a differential input stage having first and second inputs for receiving the differential analog voltage outputs, the differential input stage having a first current path controlled by the first input, and a second current path controlled by the second input; and
an output stage comprising:
a first current mirror circuit for mirroring a same current provided in the first current path to a third current path;
a second current mirror circuit for mirroring 1/10 of the current provided in the third current path to a fourth current path;
a third current mirror circuit for mirroring a same current provided in the fourth current path to a sixth current path, the sixth current path forms part of an output current path;
a fourth current mirror circuit for mirroring a same current provided in the second current path to a fifth current path; and
a fifth current mirror circuit for mirroring 1/10 of the current provided in the fifth current path to the sixth current path.

13. The high speed data receiver of claim 7 further comprising:
a second transconductance circuit connected in parallel to the transconductance circuit such that an effective transconductance is equal to a transconductance of the transconductance circuit minus a transconductance of the second transconductance circuit.

14. The high speed data receiver of claim 13 wherein the second transconductance circuit has a variable transconductance value in response to either a bias voltage or a bias current.

15. A high output impedance, low output current transconductance circuit comprising:
a first transistor having a gate coupled to a first differential voltage input, a drain coupled to a first supply voltage through a first resistance, and a source coupled to a second supply voltage through a first degenerative resistor;
a second transistor having a gate coupled to a second differential voltage input, a drain coupled to the first supply voltage through a second resistance, and a source coupled to the second supply voltage through a second degenerative resistor;
a first mirror circuit for coupling a proportionately reduced current mirror of a current through the first transistor to an output node as a pull-up current; and
a second mirror circuit for coupling a proportionately reduced current mirror of a current through the second transistor to the output node as a pull-down current.

16. The transconductance circuit of claim 15 further comprising:
a bias transistor coupled between the source of both the first and second transistors and the second supply voltage.

17. The transconductance circuit of claim 15 wherein the first and second transistors are NMOS transistors.

18. The transconductance circuit of claim 15 wherein the first and second mirror circuits reduce the current through the first and second transistor, respectively, by a factor of ten.

19. A data communication system comprising:
a transmitter for transmitting high speed data on a communication line; and
a receiver coupled to the communication line for receiving the high speed data and extracting a clock signal, the receiver comprises:
a phase detector circuit coupled to receive a high speed input data signal and provide differential analog voltage outputs indicating a signal phase difference between the high speed input data signal and a second input signal;
a transconductance circuit coupled to the phase detector circuit for converting the differential analog voltage outputs into an analog output current, wherein the transconductance circuit includes:
a fixed transconductance circuit; and
a variable transconductance circuit operably coupled to the fixed transconductance circuit to produce the analog output current;
an oscillator coupled to the transconductance circuit and providing the second input signal to the phase detector in response to the analog output current;
a phase frequency detector circuit coupled to receive an output of the oscillator and provide an output indicating a frequency difference between the output of the oscillator and a reference clock signal; and
a charge pump circuit for providing an output signal in response to the phase frequency detector circuit, the charge pump output signal is coupled to an input of the oscillator.

20. The data communication system of claim 19 wherein the high speed data has a frequency of substantially equal to 1.25 GHz and the reference clock signal is substantially equal to 62.5 MHz.

21. The data communication system of claim 19 wherein the receiver further comprises a divide circuit coupled between the oscillator and the phase frequency detector, the divide circuit divides the output of the oscillator by a predetermined value.

22. The data communication system of claim 19 wherein the oscillator is a ring oscillator.

23. The data communication system of claim 19 wherein the high speed input data signal has a frequency of substantially equal to 1.25 GHz and the oscillator provides ten output signals each having a frequency of substantially equal to 250 MHz.

24. The high speed data receiver of claim 1 wherein the transconductance circuit is configured for converting phase error information from the phase detector circuit into the analog output current, the analog output current having an amplitude that is a function of the phase error information.

25. The high speed data receiver of claim 1 wherein the oscillator is a voltage controlled oscillator.

26. The high speed data receiver of claim 1 wherein the charge pump generates at least one output current pulse having a constant amplitude and a pulse width proportional to a phase difference between the output of the oscillator and the reference clock signal.

27. The high speed data receiver of claim 1 wherein the oscillator comprises a second transconductance circuit configured to convert an intermediary analog voltage generated from the analog output current to an intermediary analog current and a ring oscillator configured to receive said intermediary analog current and to provide the second input signal.

28. A high speed data receiver comprising:
a phase detector circuit coupled to receive a high speed input data signal and provide at least two analog voltage outputs;

a transconductance circuit coupled to the phase detector circuit for converting the at least two analog voltage outputs into an analog output current, wherein the transconductance circuit includes:

a differential input stage having first and second inputs for receiving the differential analog voltage outputs, the differential input stage having a first current path controlled by the first input, and a second current path controlled by the second input; and an output stage including:

a first current mirror circuit for mirroring a same current provided in the first current path to a third current path, a second current mirror circuit for mirroring $1/10$ of the current provided in the third current path to a fourth current path;

a third current mirror circuit for mirroring a same current provided in the fourth current path to a sixth current path, the sixth current path forms part of an output current path;

a fourth current mirror circuit for mirroring a same current provided in the second current path to a fifth current path; and a fifth current mirror circuit for mirroring $1/10$ of the current provided in the fifth current path to the sixth current path; and an oscillator coupled to the transconductance circuit and providing the second input signal to the phase detector in response to the analog output current.

29. The high speed data receiver of claim 28 wherein the oscillator is a voltage controlled oscillator.

30. The high speed data receiver of claim 1 further comprising:

a phase frequency detector circuit coupled to, when enabled, produce an up/down signal based on phase and frequency differences between a divided representation of the output oscillation and a reference clock signal; and a charge pump circuit coupled to produce a current control signal based on the up/down signal, wherein the oscillator generates an initial output oscillation based on the control current signal.

\* \* \* \* \*